(12) United States Patent
Camacho et al.

(10) Patent No.: US 8,482,109 B2
(45) Date of Patent: Jul. 9, 2013

(54) INTEGRATED CIRCUIT PACKAGING SYSTEM WITH DUAL CONNECTION AND METHOD OF MANUFACTURE THEREOF

(75) Inventors: Zigmund Ramirez Camacho, Singapore (SG); Henry Descalzo Bathan, Singapore (SG); Emmanuel Espiritu, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/241,141

(22) Filed: Sep. 22, 2011

(65) Prior Publication Data

US 2013/0075883 A1 Mar. 28, 2013

(51) Int. Cl.
*H01L 23/495* (2006.01)
*H01L 23/48* (2006.01)

(52) U.S. Cl.
USPC ............ 257/666; 257/E23.051; 257/E23.092; 257/E23.124; 257/667; 257/684; 257/784; 257/786; 257/691; 257/696; 257/698; 257/692; 257/693

(58) Field of Classification Search
USPC ................. 257/666, 667, 676, 684, 796, 784, 257/786, 691–693, 696, 698, E23.051, E23.092, 257/E23.124
See application file for complete search history.

(56) References Cited

U.S. PATENT DOCUMENTS

| | | | |
|---|---|---|---|
| 5,436,500 A | 7/1995 | Park et al. | |
| 6,818,973 B1 | 11/2004 | Foster | |
| 6,924,549 B2 | 8/2005 | Nose et al. | |
| 7,211,471 B1 | 5/2007 | Foster | |
| 7,388,280 B2 | 6/2008 | Shim et al. | |
| 8,203,201 B2* | 6/2012 | Camacho et al. | 257/676 |
| 8,241,965 B2* | 8/2012 | Bathan et al. | 438/123 |
| 2005/0104168 A1* | 5/2005 | Choi et al. | 257/666 |
| 2008/0006929 A1* | 1/2008 | Punzalan et al. | 257/692 |
| 2009/0072366 A1 | 3/2009 | Badakere Govindaiah et al. | |
| 2009/0085181 A1 | 4/2009 | Advincula, Jr. et al. | |
| 2009/0236704 A1* | 9/2009 | Camacho et al. | 257/670 |
| 2009/0283882 A1* | 11/2009 | Hsieh et al. | 257/676 |
| 2010/0001384 A1 | 1/2010 | Bathan et al. | |
| 2010/0001385 A1* | 1/2010 | Caparas et al. | 257/676 |
| 2010/0123230 A1* | 5/2010 | Dahilig et al. | 257/676 |
| 2011/0201159 A1* | 8/2011 | Mori et al. | 438/123 |
| 2011/0233753 A1* | 9/2011 | Camacho et al. | 257/692 |
| 2012/0018866 A1* | 1/2012 | Camacho et al. | 257/676 |

* cited by examiner

*Primary Examiner* — A O Williams
(74) *Attorney, Agent, or Firm* — Ishimaru & Associates LLP; I-Chang John Yang

(57) ABSTRACT

A method of manufacture of an integrated circuit packaging system includes: forming a peripheral lead having a peripheral contact layer surrounding the peripheral lead with a non-horizontal side exposed from the peripheral contact layer; forming an inner lead and a paddle non-planar with the peripheral lead; mounting an integrated circuit to the paddle; and forming an encapsulation covering the integrated circuit and exposing the inner lead, the paddle, and the non-horizontal side.

20 Claims, 5 Drawing Sheets

INTEGRATED CIRCUIT PACKAGING SYSTEM WITH DUAL CONNECTION AND METHOD OF MANUFACTURE THEREOF

TECHNICAL FIELD

The present invention relates generally to an integrated circuit packaging system, and more particularly to a system for encapsulated integrated circuit.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

Thus, a need still remains for an integrated circuit packaging system with improved yield and improved reliability. In view of the ever-increasing commercial competitive pressures, along with growing consumer expectation and the diminishing opportunities for meaningful product differentiation in the marketplace, it is critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a peripheral lead having a peripheral contact layer surrounding the peripheral lead with a non-horizontal side exposed from the peripheral contact layer; forming an inner lead and a paddle non-planar with the peripheral lead; mounting an integrated circuit to the paddle; and forming an encapsulation covering the integrated circuit and exposing the inner lead, the paddle, and the non-horizontal side.

The present invention provides an integrated circuit packaging system, including: a peripheral lead having a peripheral contact layer surrounding the peripheral lead with a non-horizontal side exposed from the peripheral contact layer; an inner lead non-planar with the peripheral lead; a paddle non-planar with the peripheral lead; an integrated circuit mounted to the paddle; and an encapsulation covering the integrated circuit and exposing the inner lead, the paddle, and the non-horizontal side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
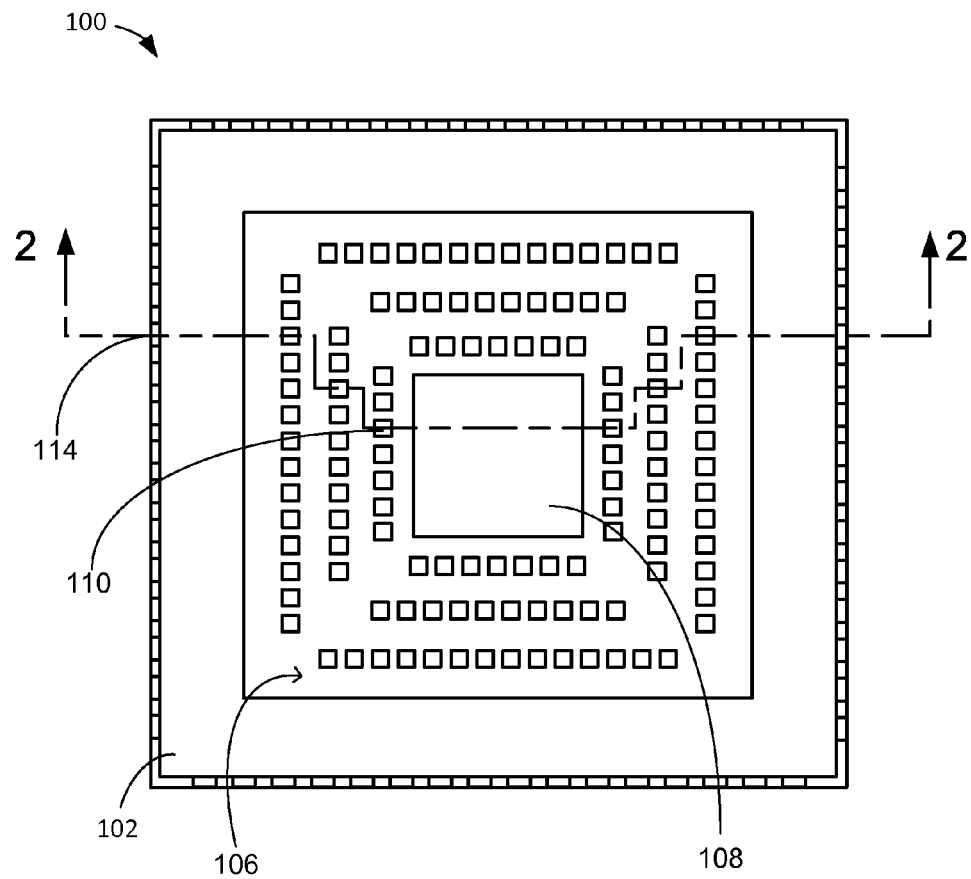
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" is defined as meaning there is direct contact between elements or components with no intervening material.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The top view depicts an encapsulation 102. The encapsulation 102 is defined as a cover that hermetically seals the contents within the integrated circuit packaging system 100 and provides protection from the environment. For example, the encapsulation 102 can be formed from a number of materials. The encapsulation 102 can be formed from epoxy molding compound (EMC) or other non-electrically conductive material. The encapsulation 102 can include an encapsulation recessed area 106.

The top view also depicts a paddle 108, more specifically a die-attached paddle. The paddle 108 can be made from a conductive structure made from copper, a copper alloy, or a conductive alloy.

Inner leads 110, which can be made from the same material used to make the paddle 108, can be formed within the encapsulation recessed area 106, around the paddle 108 in a staggered or multi-row configuration. A limited number of the inner leads 110 in a certain configuration are depicted in FIG. 1 for illustrative purposes.

Peripheral leads 114, which can be made from the same material used to make the paddle 108, can protrude from the encapsulation 102. A portion of each of the peripheral leads 114 is horizontally planar without a bend or curvature. A limited number of the peripheral leads 114 in a certain configuration are depicted in FIG. 1 for illustrative purposes.

For illustrative purposes, the integrated circuit packaging system 100 is shown with the encapsulation 102 having a square geometric configuration, although it is understood that the encapsulation 102 can have a different geometric configuration. For example, the integrated circuit packaging system 100 can have the encapsulation 102 with a rectangular geometric configuration.

Figure 2:
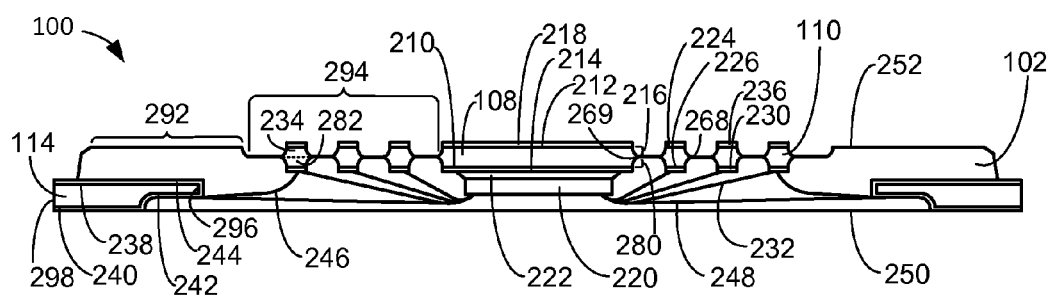
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The cross-sectional view depicts the paddle 108. The paddle 108 can have a paddle first side 212 and a paddle second side 210 at a side opposite the paddle first side 212. The encapsulation 102 can have an encapsulation first side 252 and an encapsulation second side 250 at a side opposite the encapsulation first side 252. The encapsulation first side 252 can have a raised portion 292 and a recessed portion 294. The encapsulation first side 252 can be co-planar with the paddle first side 212 along the raised portion 292.

A contact layer 214, such as a coating or plating made out of materials including gold, silver, nickel-palladium alloy, or other alloys, can be over or on the paddle second side 210. The contact layer 214 functions as a wet-enhancing layer, an adhesion layer, or a combination thereof.

The paddle 108 can be exposed from the recessed portion 294. The paddle 108 can include a paddle exterior extension 216 and a paddle interior extension 280. The paddle exterior extension 216 can extend from the recessed portion 294. The paddle interior extension 280 can be within the encapsulation 102 and does not extend from the recessed portion 294.

A paddle barrier 218, such as a coating or plating made from materials including gold, silver, nickel-palladium alloy, other alloys, or a material similar to the material used to form the contact layer 214, can be along the paddle first side 212. The paddle barrier 218 functions as an etch protection layer, an etch stop barrier, an adhesion layer, a wet-enhancing layer, or a combination thereof. The paddle barrier 218 can be optional.

An integrated circuit 220, such as an integrated circuit die or a flip chip, can be mounted over the paddle second side 210. The integrated circuit 220 can be over the contact layer 214. The integrated circuit 220 can be mounted with an adhesive 222, such as an adhesive paste or an adhesive film, between the integrated circuit 220 and the contact layer 214.

The inner leads 110 can have an inner lead first side 224 and an inner lead second side 226. The inner lead first side 224 can be co-planar with the paddle first side 212 and the raised portion 292. The inner lead second side 226 can be co-planar with the paddle second side 210.

Inner contact pads 230, such as a coating or plating made from materials including gold, silver, nickel-palladium alloy, other alloys, or a material similar to the material used to form the contact layer 214, can be over the inner lead second side 226. The inner contact pads 230 functions as a wet-enhancing layer, an adhesion layer, or a combination thereof.

The inner leads 110 can be exposed from the recessed portion 294. The inner leads 110 can include inner leads exterior extension 234 and inner leads interior extension 282. The inner leads exterior extension 234 can extend from the recessed portion 294. The inner leads interior extension 282 are within the encapsulation 102 and do not extend from the recessed portion 294.

Inner mounting pads 236 can be along the inner lead first side 224. The inner mounting pads 236 can be a coating or plating made from materials including gold, silver, nickel-palladium alloy, other alloys, or a material similar to the material used to form the contact layer 214. For example, the inner mounting pads 236 can function as an etch protection layer, an etch stop barrier, an adhesion layer, a wet-enhancing layer, or a combination thereof.

An inner interconnect 232 can connect the integrated circuit 220 and the inner leads 110. The inner interconnect 232 can be a bond wire or a ribbon bond wire. The inner interconnect 232 can be connected to the inner contact pads 230.

For illustrative purposes, the integrated circuit packaging system 100 is shown having three rows of the inner leads 110, although it is understood that the integrated circuit packaging system 100 can have a different number of the inner leads 110. For example, the integrated circuit packaging system 100 can have one of the inner leads 110 or six or more of the inner leads 110.

Where the bottom of the inner leads exterior extension 234 meets the top of the inner leads interior extension 282, a lead protrusion 268 can be along the recessed portion 294. Similarly, where the bottom of the paddle exterior extension 216 meets the bottom of the paddle interior extension 280, a paddle protrusion 269 can exist along the recessed portion 294. The lead protrusion 268 and the paddle protrusion 269 can be co-planar with the recessed portion 294.

The peripheral leads 114 can have a peripheral lead first side 238 and a peripheral lead second side 240 at a side opposite the peripheral lead first side 238. The peripheral lead first side 238 and the peripheral lead second side 240 can be horizontal. The peripheral lead second side 240 is planar to the encapsulation second side 250.

The peripheral leads 114 can also have a peripheral lead third side 296 and an external non-horizontal side 298 at a side opposite the peripheral lead third side 296. The peripheral lead third side 296 and the external non-horizontal side 298 can be the non-horizontal sides, or as a more specific example vertical sides, of the peripheral leads 114. The external non-horizontal side 298 can be the exposed side of each of the peripheral leads 114 and exposed from the encapsulation 102.

A peripheral lead indentation 242 can be formed from the peripheral lead second side 240 by removing a portion of the peripheral leads 114. For example, the peripheral lead indentation 242 can be formed from the peripheral lead second side 240 by removing a portion of the peripheral leads 114 by mechanical or chemical process.

A peripheral contact layer 244, such as a coating or plating made from materials including gold, silver, nickel-palladium alloy, other alloys, or a material similar to the material used to form the contact layer 214, can be along the peripheral lead first side 238, the peripheral lead second side 240 including the peripheral lead indentation 242, and the peripheral lead third side 296, but not along the external non-horizontal side 298.

A peripheral outer interconnect 246 can connect the peripheral leads 114 and the inner leads 110. The peripheral outer interconnect can be a bond wire or a ribbon bond wire. The peripheral outer interconnect 246 can be connected between the inner contact pads 230 and the peripheral contact layer 244. As a specific example, the peripheral outer interconnect 246 can be connected to the peripheral contact layer 244 along the peripheral lead indentation 242.

More interconnect options are available for the peripheral leads 114. For example, a peripheral inner interconnect 248 can connect the peripheral leads 114 and the integrated circuit 220. The peripheral inner interconnect 248 can connect the integrated circuit 220 and the peripheral contact layer 244 along the peripheral lead indentation 242.

Figure 3:
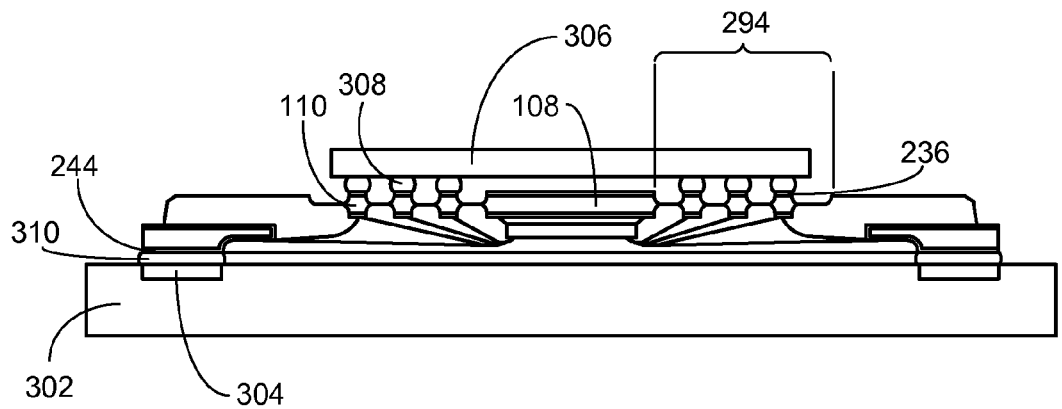
FIG. 3 is a cross-sectional view of the integrated circuit packaging system along the line 2-2 of FIG. 1 mounted on an integrated circuit carrier

Referring now to FIG. 3, therein is shown a cross-sectional view of the integrated circuit packaging system 100 along the line 2-2 of FIG. 1 mounted on an integrated circuit carrier 302. The integrated circuit carrier 302 is defined as a structure over which integrated circuit can be mounted and provides layout and routings for electrical signals for integrated circuit. For example, the integrated circuit carrier 302 can be a printed circuit board (PCB). The peripheral contact layer 244 can connect with conductive pathways 304. As a specific example, a solder 310 can be used to connect the peripheral contact layer 244 and the conductive pathways 304.

The FIG. 3 also depicts a stacking device 306 stacked on the integrated circuit packaging system 100. The stacking device 306 can be a flip chip, a ball grid array (BGA), an embedded wafer level ball grid array (eWLBGA), or a wafer level chip scale package (WLCSP). The inner mounting pads 236 can make electrical contact with stacking device contact pads 308. For example, the stacking device contact pads 308 can be solder balls of a BGA.

It has been discovered that the present invention provides the integrated circuit packaging system 100 with improved thermal management and thermal performance by having the recessed portion 294 provide enhanced air flow gap around the inner leads 110 and the paddle 108.

It has also been discovered that the present invention provides the integrated circuit packaging system 100 and the stacking device 306 as a combined unit improved thermal management and thermal performance by having the recessed portion 294 provide enhanced air flow gap around the inner leads 110, the paddle 108, and the stacking device contact pads 308.

Figure 4:
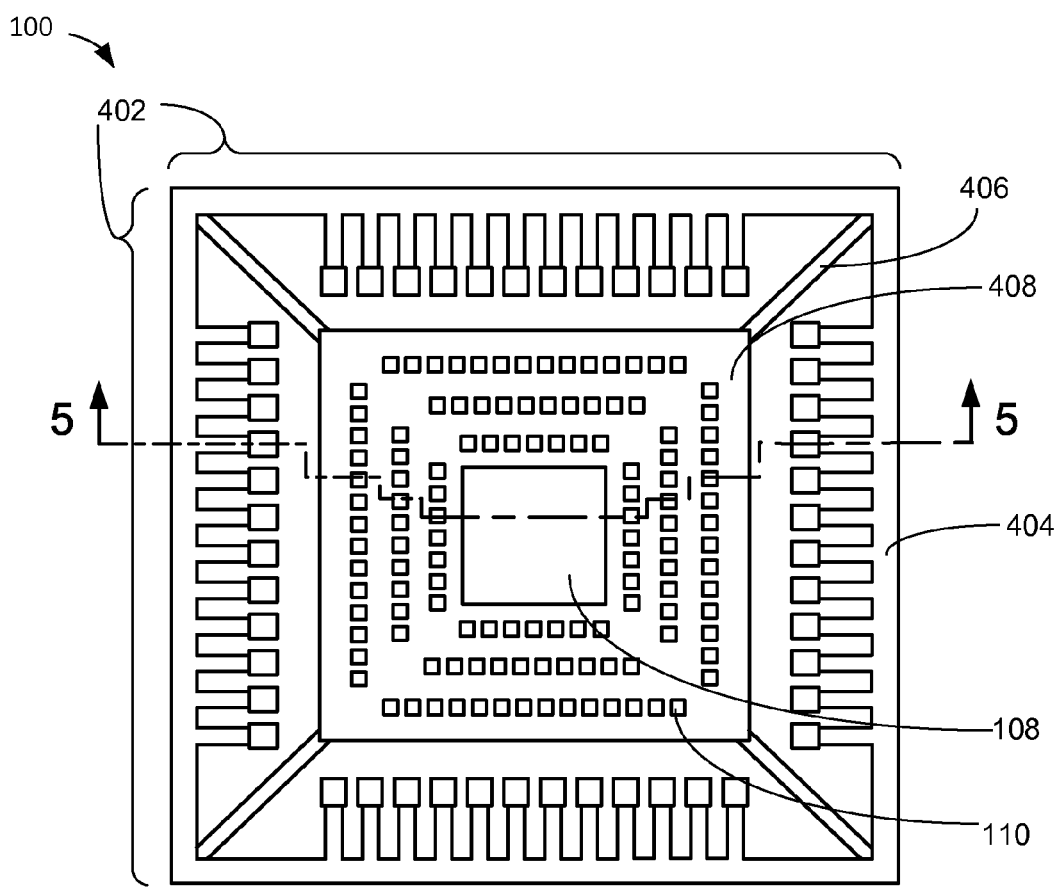
FIG. 4 is a top view of the integrated circuit packaging system 100 in a manufacturing step with a leadframe and a frame paddle.

Referring now to FIG. 4, therein is shown a top view of the integrated circuit packaging system 100 in a manufacturing step with a leadframe 402. The leadframe 402 can include a frame paddle 408. The leadframe 402 can also include dam bars 404 along the sides of the leadframe 402. The dam bars 404 can be connected to one another at their ends and form the corners of the leadframe 402. The dam bars 404 can hold together the peripheral leads 114 of FIG. 1.

The leadframe 402 can also include tie bars 406. The tie bars 406 keep the frame paddle 408 attached to the dam bars 404 by connecting the corners of the portion of the leadframe 402 depicted to the corners of the frame paddle 408. The frame paddle 408 can include the paddle 108 and the inner leads 110 around the paddle 108 in a staggered or multi-row configuration.

Figure 5:
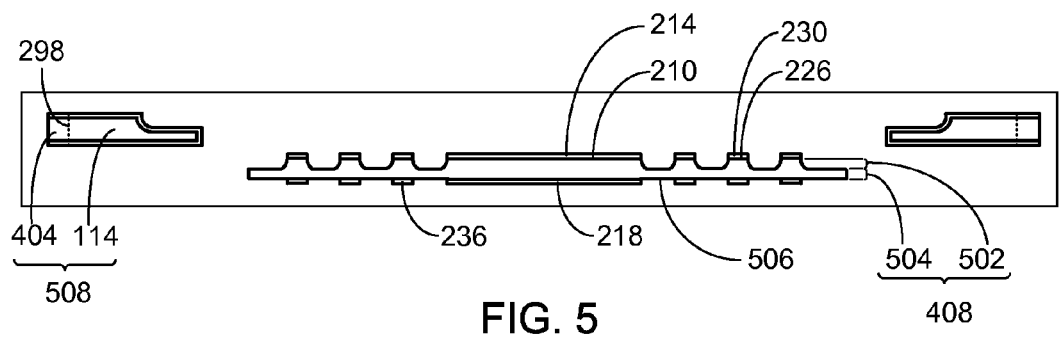
FIG. 5 is a cross-sectional view of FIG. 4. along line 5-5 of FIG. 4.

Referring now to FIG. 5, therein is shown a cross-sectional view of FIG. 4. along 5-5. The frame paddle 408 can include a frame paddle top portion 502 and a frame paddle bottom portion 504 in the current orientation of FIG. 5. The frame paddle 408 can include a frame paddle first side 506.

The frame paddle top portion 502 can include the paddle interior extension 280 of FIG. 2 and the inner leads interior extension 282 of FIG. 2. The contact layer 214 can be on the paddle interior extension 280, along the paddle second side 210. The inner contact pads 230 can be on the inner leads interior extension 282, along the inner lead second side 226.

The frame paddle bottom portion 504 can include the paddle barrier 218 and the inner mounting pads 236 along the frame paddle first side 506. The paddle barrier 218 can be formed by plating or coating materials including gold, silver, nickel-palladium alloy, other alloys, or a material similar to the material used to form the contact layer 214 along the portion of the frame paddle first side 506 where the paddle exterior extension 216 of FIG. 2 is to be formed. The inner mounting pads 236 can be formed by plating or coating materials including gold, silver, nickel-palladium alloy, other alloys, or a material similar to the material used to form the contact layer 214 along the portion of the frame paddle first side 506 where the inner leads exterior extension 234 of FIG. 2 is to be formed.

Dam leads 508 include a portion of the dam bars 404 and the peripheral leads 114. The external non-horizontal side 298 is illustrated with the dotted line within the dam leads 508. The peripheral leads 114 can be formed when the portion of the dam bars 404 is removed in the manufacturing process that separates the integrated circuit packaging system from the leadframe 402.

Figure 6:
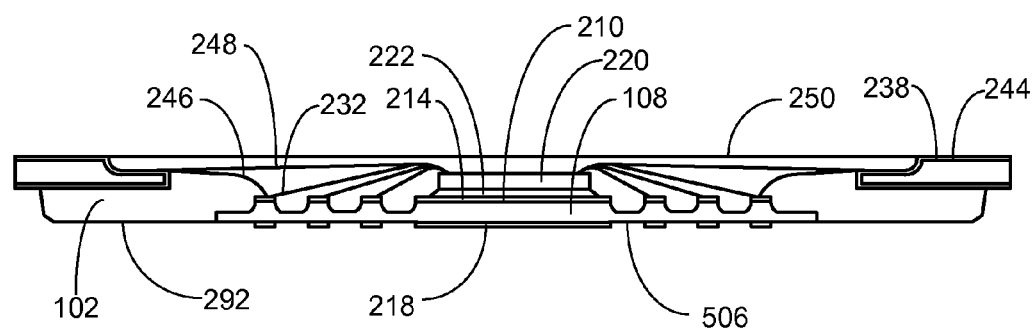
FIG. 6 is a structure of FIG. 5 in an encapsulating step.

Referring now to FIG. 6, therein is shown a structure of FIG. 5 in an encapsulating step. The integrated circuit 220 can be mounted over the paddle 108 over the paddle second side 210. The integrated circuit 220 can be mounted with the adhesive 222 over the contact layer 214. The inner interconnect 232, the peripheral outer interconnect 246, and the peripheral inner interconnect 248 are connected.

The raised portion 292 is co-planar with the frame paddle first side 506. The paddle barrier 218 is below the encapsulation 102. The encapsulation second side 250 is horizontal and co-planar with the portion of the peripheral contact layer 244 along the peripheral lead first side 238. The peripheral contact layer 244 along the peripheral lead first side 238 are electrically exposed. The portion of the peripheral contact layer 244 along the peripheral lead indentation 242 are within the encapsulation 102. The encapsulation 102 is also between the paddle interior extension 280 and the inner leads interior extension 282.

Figure 7:
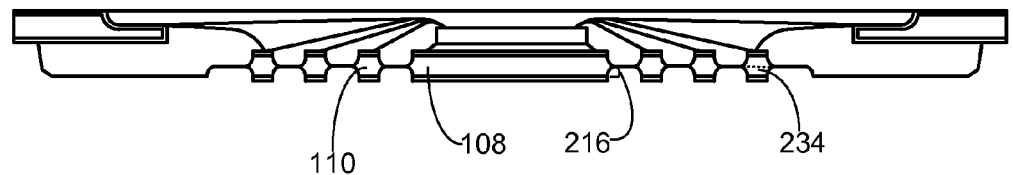
FIG. 7 is a structure of FIG. 6 in an electrical isolation step.

Referring now to FIG. 7, therein is shown a structure of FIG. 6 in an electrical isolation step. The paddle 108 and the inner leads 110 can be electrically isolated to form the paddle exterior extension 216 and the inner leads exterior extension 234. For example, copper etching can be performed on the frame paddle 408 on the frame paddle first side 506 of FIG. 5. The copper etching process can expose the encapsulation recessed area 106 of FIG. 1 and electrically isolate the inner leads 110 and the paddle 108. The FIG. 7 depicts the upside down view of the FIG. 2.

It has been discovered that the present invention provides the integrated circuit packaging system 100 having simplified manufacturing process with improved reliability and yield. The leadframe 402 of FIG. 4 includes the peripheral leads 114 that are horizontally planar, not having gone through the bending process. The peripheral leads 114 are not bent before or after etching process or plating process. This eliminates a manufacturing step and removes a potential source of manufacturing defects.

Figure 8:
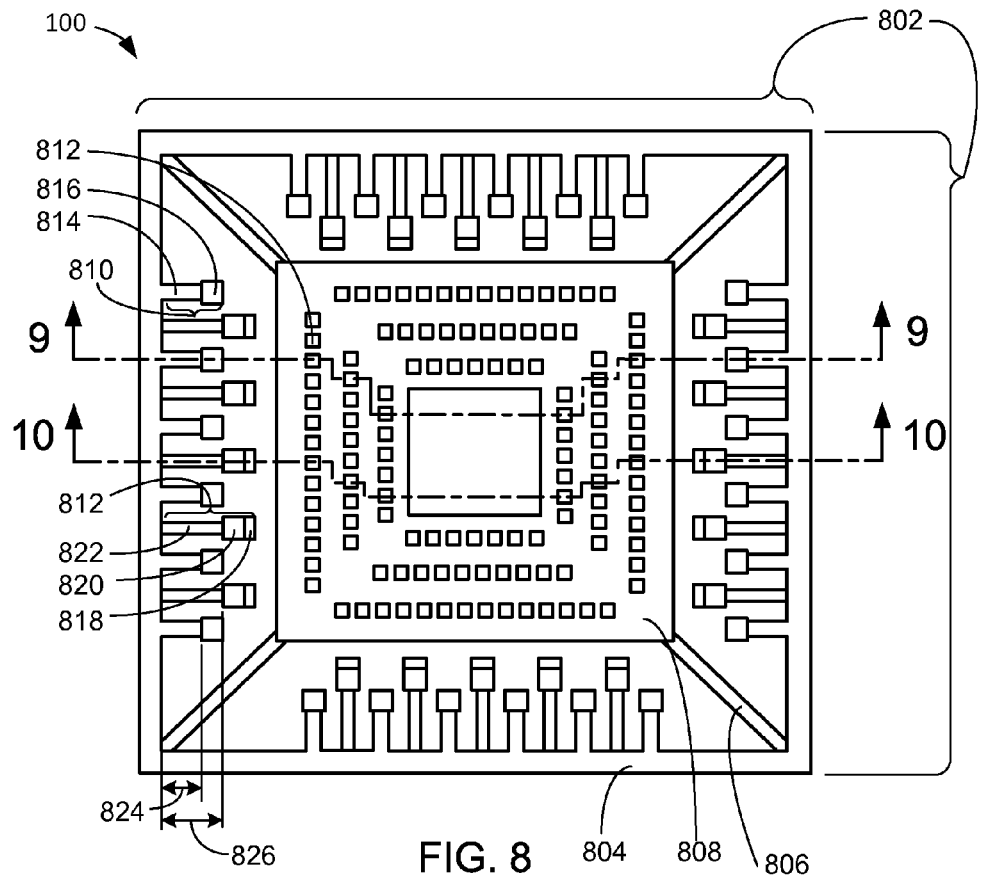
FIG. 8 is a top view of a dual peripheral leadframe in a second embodiment of the present invention.

Referring now to FIG. 8, therein is shown a top view of a dual peripheral leadframe 802 in a second embodiment of the present invention. The dual peripheral leadframe 802 can include a frame paddle 808, dam bars 804, and tie bars 806. The dam bars 804 hold together outer peripheral leads 810 and inner peripheral leads 812. The outer peripheral leads 810 and the inner peripheral leads 812 are formed next to each other in a staggered fashion. The tie bars 806 keep the frame paddle 808 attached to the dam bars 804.

The outer peripheral leads 810 can include an outer indentation 814 and an outer contact 816. The inner peripheral leads 812 can include an inner indentation 818, an inner contact 820, and an inner isolation indentation 822.

The outer contact 816 can have an outer contact width 824. The inner isolation indentation 822 can have an inner isolation indentation width 826. The outer contact width 824 is shorter than the inner isolation indentation width 826. This arrangement prevents the outer contact 816 from making electrical contact with the inner contact 820 of the inner peripheral leads 812 when the outer peripheral leads 810 are formed next to the inner peripheral leads 812 in a staggered fashion.

Figure 9:
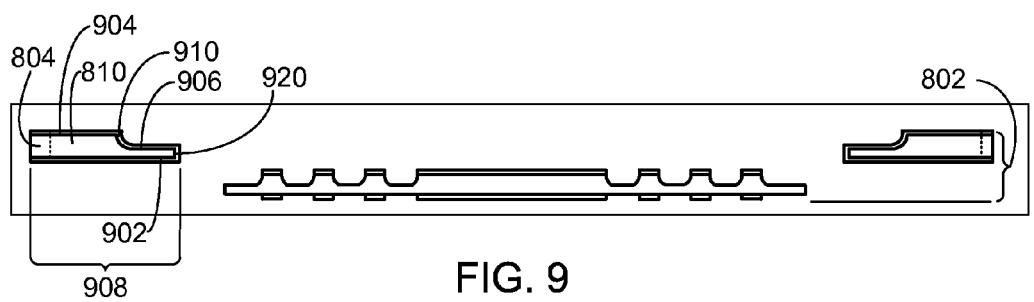
FIG. 9 is a cross-sectional view of the dual peripheral leadframe along line 9-9 of FIG. 8.

Referring now to FIG. 9, therein is shown a cross-sectional view of the dual peripheral leadframe 802 along line 9-9 of FIG. 8. Outer dam leads 908 include a portion of the dam bars 804 and the outer peripheral leads 810. The outer peripheral leads 810 can have an outer peripheral lead first side 902, an outer peripheral lead second side 904, and an outer peripheral lead third side 920. The outer peripheral lead second side 904 can include an outer indentation side 906. Outer peripheral contact pads 910, such as a coating or plating made from materials including gold, silver, nickel-palladium alloy, other alloys, or a material similar to the material used to form the contact layer 214 of FIG. 2 can be along the outer peripheral lead first side 902, the outer peripheral lead second side 904 including the outer indentation side 906, the outer peripheral lead third side 920, and a portion of the dam bars 804.

Figure 10:
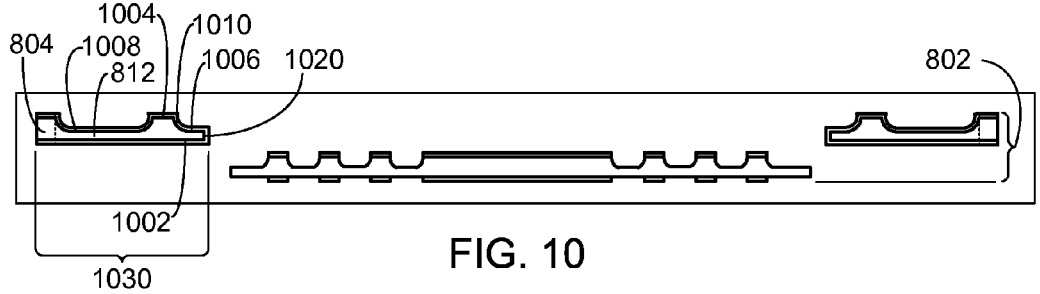
FIG. 10 is a cross-sectional view of the dual peripheral leadframe along line 10-10 of FIG. 8.

Referring now to FIG. 10, therein is shown a cross-sectional view of the dual peripheral leadframe 802 along line 10-10 of FIG. 8. Inner dam leads 1030 include a portion of the dam bars 804 and the inner peripheral leads 812. The inner peripheral leads 812 can have an inner peripheral lead first side 1002, an inner peripheral lead second side 1004, and an inner peripheral lead third side 1020. The inner peripheral lead second side 1004 can include an inner indentation side 1006 and an inner isolation indentation side 1008. Inner peripheral contact pads 1010, such as a coating or plating made from materials including gold, silver, nickel-palladium alloy, other alloys, or a material similar to the material used to form the contact layer 214 of FIG. 2, can be along the inner peripheral lead first side 1002, the inner peripheral lead second side 1004 including the inner indentation side 1006 and the inner isolation indentation side 1008, the inner peripheral lead third side 1020, and a portion of the dam bars 804.

It has been discovered that the present invention provides the integrated circuit packaging system 100 with dual row peripheral leads having more peripheral leads count, thus providing higher I/O count and I/O density. This enables manufacturers to use smaller integrated circuit packaging and/or attach integrated circuits with higher I/O count. This allows manufacturers to have flexibility in packaging options and lower manufacturing cost.

Figure 11:
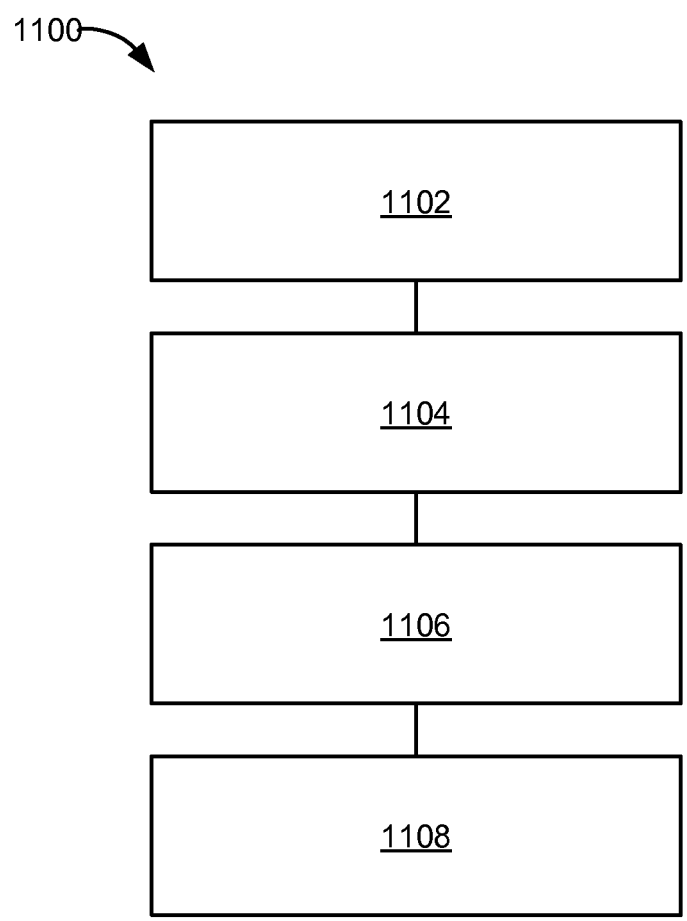
FIG. 11 is a flow chart of a method of manufacture of an integrated circuit packaging system in a further embodiment of the present invention.

Referring now to FIG. 11 therein is shown a flow chart of a method 1100 of manufacture of an integrated circuit packaging system in an embodiment of the present invention. The method 1100 includes: forming a peripheral lead having a peripheral contact layer surrounding the peripheral lead with a non-horizontal side exposed from the peripheral contact layer in a block 1102; forming an inner lead and a paddle non-planar with the peripheral lead in a block 1104; mounting an integrated circuit to the paddle in a block 1106; and forming an encapsulation covering the integrated circuit and exposing the inner lead, the paddle, and the non-horizontal side in a block 1108.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   forming a peripheral lead having a peripheral contact layer surrounding the peripheral lead with a non-horizontal side exposed from the peripheral contact layer;
   forming an inner lead and a paddle non-planar with the peripheral lead;
   mounting an integrated circuit to the paddle;
   forming an encapsulation covering the integrated circuit and exposing the non-horizontal side, the encapsulation having a recessed portion exposing the inner lead and the paddle; and
   mounting a stacking device over the inner lead providing a gap between the stacking device and the recessed portion.

2. A method of manufacture of an integrated circuit packaging system comprising:
   forming a peripheral lead having a peripheral contact layer surrounding the peripheral lead with a non-horizontal side exposed from the peripheral contact layer;
   forming an inner lead and a paddle non-planar with the peripheral lead;
   mounting an integrated circuit to the paddle;
   forming an encapsulation covering the integrated circuit and exposing the non-horizontal side, the encapsulation having a recessed portion exposing the inner lead and the paddle;
   forming a paddle barrier on the paddle, and wherein forming the encapsulation includes:
   forming the encapsulation having a recessed portion from an encapsulation first side; and
   forming the encapsulation first side coplanar with a side of the paddle barrier facing the encapsulation.

3. The method as claimed in claim 1 wherein forming the encapsulation having a recessed portion from an encapsulation first side and an encapsulation second side opposite the encapsulation first side, the encapsulation second side coplanar with a portion of the peripheral contact layer.

4. The method as claimed in claim 1 wherein forming the encapsulation includes forming the encapsulation with a portion of the peripheral contact layer exposed from the encapsulation.

5. An integrated circuit packaging system comprising:
   a peripheral lead having a peripheral contact layer surrounding the peripheral lead with a non-horizontal side exposed from the peripheral contact layer;
   an inner lead non-planar with the peripheral lead;
   a paddle non-planar with the peripheral lead;
   an integrated circuit mounted to the paddle;
   an encapsulation covering the integrated circuit and exposing the inner lead, the paddle, and the non-horizontal side, the encapsulation includes a recessed portion exposing the inner lead and the paddle, and
   a stacking device over the inner lead providing a gap between the stacking device and the recessed portion.

6. The system as claimed in claim 5 wherein:
   the inner leads protrude from the recessed portion.

7. The system as claimed in claim 5 further comprising:
   an inner contact pad on the inner lead.

8. The system as claimed in claim 5 wherein:
   the peripheral lead includes a peripheral lead indentation and the peripheral lead indentation covered by the peripheral contact layer, and further comprising:
   a peripheral inner interconnect between the integrated circuit and the peripheral contact layer at the peripheral lead indentation.

9. The system as claimed in claim 5 wherein:
   the peripheral lead includes a peripheral lead indentation and the peripheral lead indentation covered by the peripheral contact layer; and
   the encapsulation covers the peripheral contact layer at the peripheral lead indentation.

10. An integrated circuit packaging system comprising:
    a peripheral lead having a peripheral contact layer surrounding the peripheral lead with a non-horizontal side exposed from the peripheral contact layer;
    an inner lead non-planar with the peripheral lead;
    a paddle non-planar with the peripheral lead;
    an integrated circuit mounted to the paddle;
    an encapsulation covering the integrated circuit and exposing the inner lead, the paddle, and the non-horizontal side, the encapsulation includes a recessed portion exposing the inner lead and the paddle, and
    a paddle barrier on the paddle; and wherein:
    the encapsulation includes a recessed portion from an encapsulation first side and the encapsulation first side coplanar with a side of the paddle barrier facing the encapsulation.

11. The system as claimed in claim 5 wherein the encapsulation has a recessed portion from an encapsulation first side and an encapsulation second side opposite the encapsulation first side, the encapsulation second side coplanar with a portion of the peripheral contact layer.

12. The system as claimed in claim 5 wherein the peripheral contact layer includes a portion of the peripheral contact layer exposed from the encapsulation.

13. The method as claimed in claim 2 wherein forming the encapsulation having a recessed portion from an encapsulation first side and an encapsulation second side opposite the encapsulation first side, the encapsulation second side coplanar with a portion of the peripheral contact layer.

14. The method as claimed in claim 2 wherein forming the encapsulation includes forming the encapsulation with a portion of the peripheral contact layer exposed from the encapsulation.

15. The system as claimed in claim 10 wherein:
    the inner leads protrude from the recessed portion.

16. The system as claimed in claim 10 further comprising:
    an inner contact pad on the inner lead.

17. The system as claimed in claim 10 wherein:
    the peripheral lead includes a peripheral lead indentation and the peripheral lead indentation covered by the peripheral contact layer, and further comprising:
    a peripheral inner interconnect between the integrated circuit and the peripheral contact layer at the peripheral lead indentation.

18. The system as claimed in claim 10 wherein:
    the peripheral lead includes a peripheral lead indentation and the peripheral lead indentation covered by the peripheral contact layer, and
    the encapsulation covers the peripheral contact layer at the peripheral lead indentation.

19. The system as claimed in claim 10 wherein the encapsulation has a recessed portion from an encapsulation first side and an encapsulation second side opposite the encapsulation first side, the encapsulation second side coplanar with a portion of the peripheral contact layer.

20. The system as claimed in claim 10 wherein the peripheral contact layer includes a portion of the peripheral contact layer exposed from the encapsulation.

* * * * *